(12) United States Patent
Liu

(10) Patent No.: US 12,089,476 B2
(45) Date of Patent: Sep. 10, 2024

(54) IMAGE SENSOR AND MANUFACTURING METHOD THEREOF, AND DISPLAY DEVICE

(71) Applicant: BOE Technology Group Co., Ltd., Beijing (CN)

(72) Inventor: Ming Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 439 days.

(21) Appl. No.: 17/676,388

(22) Filed: Feb. 21, 2022

(65) Prior Publication Data
US 2022/0285462 A1    Sep. 8, 2022

(30) Foreign Application Priority Data
Mar. 3, 2021  (CN) .......................... 202110235235.9

(51) Int. Cl.
| | |
|---|---|
| *H10K 59/65* | (2023.01) |
| *H01L 27/146* | (2006.01) |
| *H04N 25/00* | (2023.01) |
| *H10K 59/121* | (2023.01) |
| *H01L 29/786* | (2006.01) |

(52) U.S. Cl.
CPC ....... *H10K 59/65* (2023.02); *H01L 27/14603* (2013.01); *H01L 27/1461* (2013.01); *H01L 27/14616* (2013.01); *H01L 27/14643* (2013.01); *H01L 27/14689* (2013.01); *H04N 25/00* (2023.01); *H10K 59/1213* (2023.02); *H01L 29/78675* (2013.01)

(58) Field of Classification Search
CPC .... H10K 59/65; H10K 59/1213; H10K 59/60; H01L 27/14643; H01L 27/14609
See application file for complete search history.

(56) References Cited

U.S. PATENT DOCUMENTS

2020/0137325 A1\* 4/2020 Mori ...................... H04N 25/60

\* cited by examiner

*Primary Examiner* — Wasiul Haider
(74) *Attorney, Agent, or Firm* — IPro, PLLC

(57) ABSTRACT

The present disclosure provides an image sensor, a manufacturing method thereof and a display device. The image sensor includes: a substrate; a first photodiode and a second photodiode located on the substrate, the first photodiode including a first electrode, a second electrode, and a first semiconductor structure located between the first electrode and the second electrode, the second photodiode including a third electrode, a fourth electrode, and a second semiconductor structure located between the third electrode and the fourth electrode, the first electrode being connected to the third electrode, the second electrode being connected to the fourth electrode; a switching thin film transistor, a source or a drain of the switching thin film transistor being connected to the second electrode or the first electrode; a capacitor connected in parallel with the first photodiode and the second photodiode for storing electrical signals when the image sensor receives light.

16 Claims, 2 Drawing Sheets

IMAGE SENSOR AND MANUFACTURING METHOD THEREOF, AND DISPLAY DEVICE

CROSS-REFERENCE TO RELATED APPLICATIONS

This application claims priority to Chinese Patent Application No. 202110235235.9 filed in China on Mar. 3, 2021, the entire contents of which are hereby incorporated by reference.

TECHNICAL FIELD

The present disclosure relates to the field of sensor technology, and in particular to an image sensor and a manufacturing method thereof, and a display device.

BACKGROUND

Existing image sensors use photodiodes to detect light. The photodiode is a semiconductor device that converts received light signals into electrical signals. However, the intensity of the electrical signals generated by the photodiodes is small, which affects the detection accuracy.

SUMMARY

In an aspect, an image sensor is provided, including:
a substrate;
a first photodiode and a second photodiode located on the substrate, the first photodiode including a first electrode, a second electrode, and a first semiconductor structure located between the first electrode and the second electrode, the second photodiode including a third electrode, a fourth electrode, and a second semiconductor structure located between the third electrode and the fourth electrode, the first electrode being connected to the third electrode, the second electrode being connected to the fourth electrode;
a switching thin film transistor, a source or a drain of the switching thin film transistor being connected to the second electrode or the first electrode; and
a capacitor connected in parallel with the first photodiode and the second photodiode for storing electrical signals when the image sensor receives light.

Optionally, the second electrode and the fourth electrode are an integral structure, and/or, the first electrode and the third electrode are an integral structure.

Optionally, the capacitor includes a first electrode plate and a second electrode plate, the first electrode plate is connected to the first electrode, the second electrode plate is connected to the second electrode.

Optionally, the first semiconductor structure includes: a first N-type low temperature polysilicon layer, a first P-type amorphous silicon layer, a first intrinsic amorphous silicon layer located between the first N-type low temperature polysilicon layer and the first P-type amorphous silicon layer;
the second semiconductor structure includes: a second N-type low temperature polysilicon layer, a second P-type low temperature polysilicon layer, a second intrinsic low temperature polysilicon layer located between the second N-type low temperature polysilicon layer and the second P-type low temperature polysilicon layer.

Optionally, the first N-type low temperature polysilicon layer also serves as the second N-type low temperature polysilicon layer.

Optionally, the second N-type low temperature polysilicon layer, the second P-type low temperature polysilicon layer and the second intrinsic low temperature polysilicon layer are located in a same layer;
the first N-type low temperature polysilicon layer, the first intrinsic amorphous silicon layer, and the first P-type amorphous silicon layer are sequentially stacked in a direction away from the substrate.

Optionally, the second electrode is located on a side of the first P-type amorphous silicon layer away from the substrate, an orthographic projection of the second electrode on the substrate at least partially overlaps with an orthographic projection of the first P-type amorphous silicon layer on the substrate, and the second electrode is a transparent electrode.

Optionally, the orthographic projection of the second electrode on the substrate coincides with the orthographic projection of the first P-type amorphous silicon layer on the substrate.

Optionally, an orthographic projection of the second intrinsic low temperature polysilicon layer on the substrate partially overlaps with or does not overlap with an orthographic projection of the first intrinsic amorphous silicon layer on the substrate.

Optionally, the first photodiode and the second photodiode have different detection wavebands.

The embodiments of the present disclosure further provide a display device including the above image sensor.

Optionally, the display device includes a driving thin film transistor and a light emitting unit connected to the driving thin film transistor,
a gate of the driving thin film transistor and a gate of the switching thin film transistor are arranged in a same layer by using a same material; and/or
a source of the driving thin film transistor and a source of the switching thin film transistor are arranged in a same layer by using a same material; and/or
a drain of the driving thin film transistor and a drain of the switching thin film transistor are arranged in a same layer by using a same material; and/or
an active layer of the driving thin film transistor and an active layer of the switching thin film transistor are arranged in a same layer by using a same material.

Optionally, the light emitting unit includes an anode, a cathode, and a light emitting layer located between the anode and the cathode, the anode and the second electrode plate of the capacitor are arranged in a same layer by using a same material; and/or
the first electrode plate of the capacitor and the source of the driving thin film transistor are arranged in a same layer by using a same material.

The embodiments of the present disclosure further provide a manufacturing method of an image sensor including:
providing a substrate;
forming a first photodiode and a second photodiode on the substrate, the first photodiode including a first electrode, a second electrode, and a first semiconductor structure located between the first electrode and the second electrode, the second photodiode including a third electrode, a fourth electrode, and a second semiconductor structure located between the third electrode and the fourth electrode, the first electrode being connected to the third electrode, the second electrode being connected to the fourth electrode;

forming a switching thin film transistor on the substrate, a source or a drain of the switching thin film transistor being connected to the second electrode or the first electrode;

forming a capacitor on the substrate, the capacitor including a first electrode plate and a second electrode plate, the first electrode plate being connected to the first electrode, the second electrode plate being connected to the second electrode.

Optionally, the forming the first semiconductor structure includes:

sequentially forming a first N-type low temperature polysilicon layer, a first intrinsic amorphous silicon layer, and a first P-type amorphous silicon layer in a direction away from the substrate;

the forming the second semiconductor structure includes:

forming a second N-type low temperature polysilicon layer, a second P-type low temperature polysilicon layer, a second intrinsic low temperature polysilicon layer located between the second N-type low temperature polysilicon layer and the second P-type low temperature polysilicon layer, which are arranged in a same layer.

Optionally, the forming the first semiconductor structure includes:

depositing an amorphous silicon layer;

doping the amorphous silicon layer to form the first intrinsic amorphous silicon layer and the first P-type amorphous silicon layer;

wherein, when the amorphous silicon layer is deposited, the band gap of the amorphous silicon layer is adjusted so that the detection wavebands of the first photodiode and the second photodiode are different.

Figure 1:
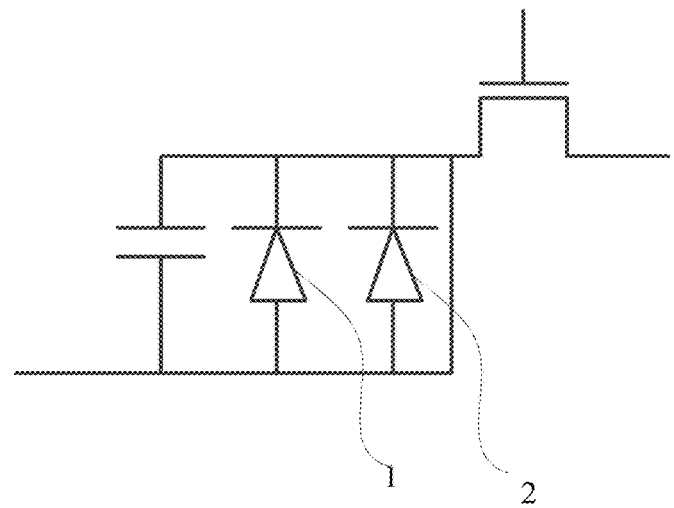
FIG. 1 is a schematic circuit diagram of an image sensor according to an embodiment of the disclosure.

REFERENCE NUMERALS 1 first photodiode
2 second photodiode
3 substrate
41 second N-type low temperature polysilicon layer
42 second intrinsic low temperature polysilicon layer
43 second P-type low temperature polysilicon layer
44 source-drain contact area
45 active layer
5 gate insulation layer
61 gate of switching thin film transistor
62 gate of driving thin film transistor
7 first intrinsic amorphous silicon layer
8 first P-type amorphous silicon layer
9 second electrode
10 interlayer insulation layer
111 first electrode
112 source of switching thin film transistor
113 drain of switching thin film transistor
115 source of driving thin film transistor
116 drain of driving thin film transistor
114 connection line
12 planarization layer
13 transparent conductive layer
14 pixel definition layer
15 encapsulation layer
117 capacitor

DETAILED DESCRIPTION

In order to make the technical problems, technical solutions, and advantages to be solved by the embodiments of the present disclosure clearer, a detailed description will be given below with reference to the accompanying drawings and specific embodiments.

The embodiments of the present disclosure provides an image sensor and a manufacturing method thereof, and a display device which can improve the detection accuracy of the image sensor.

An embodiment of the present disclosure provides an image sensor including:

a substrate;

a first photodiode and a second photodiode located on the substrate, the first photodiode including a first electrode, a second electrode, and a first semiconductor structure located between the first electrode and the second electrode, the second photodiode including a third electrode, a fourth electrode, and a second semiconductor structure located between the third electrode and the fourth electrode, the first electrode being connected to the third electrode, the second electrode being connected to the fourth electrode;

a switching thin film transistor, a source or a drain of the switching thin film transistor being connected to the second electrode or the first electrode; and a capacitor connected in parallel with the first photodiode and the second photodiode for storing electrical signals when the image sensor receives light.

In the embodiment, the image sensor includes two photodiodes connected in parallel, the two photodiodes share a capacitor, and the two photodiodes charge the capacitor at the same time, which can increase the signal strength and improve the detection accuracy; on the other hand, the two photodiodes can detect different wavebands to achieve different application effects. For example, the first photodiode can detect the visible light waveband for fingerprint recognition, and the second photodiode can detect the infrared light waveband.

Optionally, the first electrode is connected to the third electrode, and the second electrode is connected to the fourth electrode, thereby realizing the parallel connection of the first photodiode and the second photodiode; one of the source and drain of the switching thin film transistor is/are connected to the second electrode or the first electrode, and the other can be connected to a detection signal line. FIG. 1 is a schematic circuit diagram of the image sensor. The first photodiode 1 and the second photodiode 2 are connected in parallel. When the image sensor receives light, the first photodiode 1 and the second photodiode 2 generate electrical signals and store them in the capacitor. After the capacitor is fully charged, the switching thin film transistor is turned on and the capacitor is discharged. And thus the signals generated by the two photodiodes can be transmitted to the detection signal line, and then transmitted by the detection signal line to a corresponding circuit for processing, so as to realize the detection of light intensity.

The image sensor according to the embodiment of the present disclosure has the following beneficial effects:

In the present solution, the image sensor includes two photodiodes connected in parallel, and the two photodiodes share a capacitor, and the two photodiodes charge the capacitor at the same time, which can increase the signal strength and improve the detection accuracy; on the other hand, the two photodiodes can detect different wavebands to achieve different application effects. For example, the first photodiode can detect the visible light waveband for fingerprint recognition, and the second photodiode can detect the infrared light waveband.

In order to simplify the structure of the image sensor, in some embodiments, the second electrode and the fourth electrode are an integral structure, and/or, the first electrode and the third electrode are an integral structure, and it may also be possible that the first electrode and the third electrode are an integral structure.

A photodiode generally adopts a PIN structure, which is composed of an N-type semiconductor layer, a P-type semiconductor layer, and an intrinsic semiconductor layer located between the N-type semiconductor layer and the P-type semiconductor layer. Among them, the semiconductor layer can be made of low temperature polysilicon or amorphous silicon. Since the band gap of the amorphous silicon can be changed by adjusting the deposition process of the amorphous silicon, the absorption wavelength of the amorphous silicon can be changed. Therefore, the intrinsic semiconductor layer of at least one of the first photodiode and the second photodiode can be made of amorphous silicon, so that the detection wavelength of at least one of the first photodiode and the second photodiode can be adjusted, so that the two photodiodes can detect different wavebands to achieve different application effect. Of course, if the detection wavebands of the first photodiode and the second photodiode are the same, the semiconductor layers of both the first photodiode and the second photodiode can be made of low temperature polysilicon.

If the detection wavebands of the first photodiode and the second photodiode are different, the image sensor can achieve different application effects. For example, the first photodiode can detect visible light and the second photodiode can detect infrared light. Thus, the sensor can detect both visible light and infrared light. The image sensor can detect the visible light band for fingerprint recognition, and it can also detect the infrared light band for night scene imaging.

In some embodiments, the first semiconductor structure may include: a first N-type low temperature polysilicon layer, a first P-type amorphous silicon layer, a first intrinsic amorphous silicon layer located between the first N-type low temperature polysilicon layer and the first P-type amorphous silicon layer;

the second semiconductor structure may include: a second N-type low temperature polysilicon layer, a second P-type low temperature polysilicon layer, a second intrinsic low temperature polysilicon layer located between the second N-type low temperature polysilicon layer and the second P-type low temperature polysilicon layer.

Figure 2:
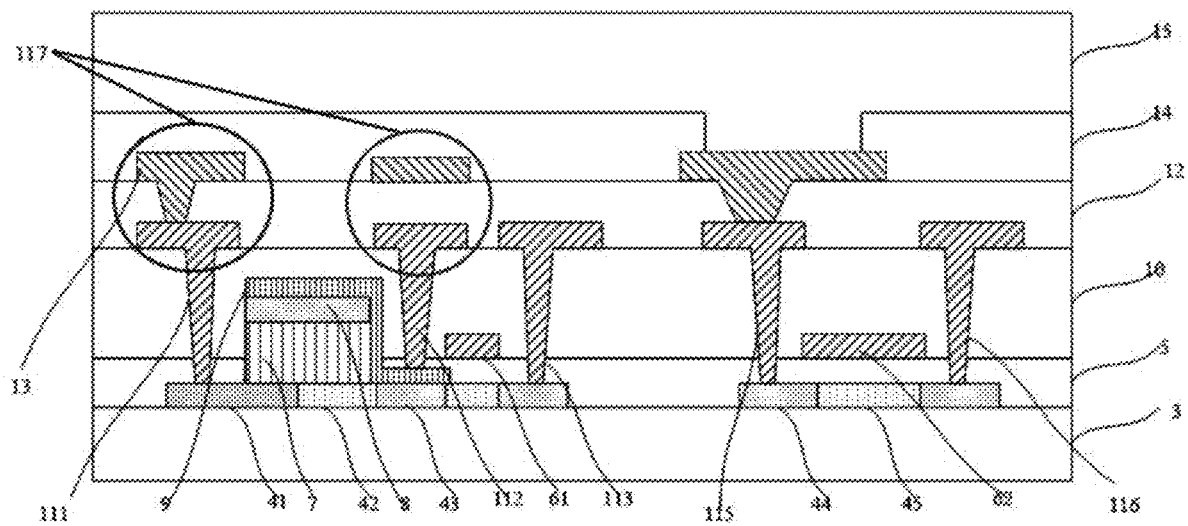
FIGS. 2 to 4 are schematic structural diagrams of image sensors according to the embodiments of the disclosure.

In a specific embodiment, as shown in FIG. 2, the image sensor includes a low temperature polysilicon layer on a substrate 3, and ion doping is performed on the low temperature polysilicon layer to form a second N-type low temperature polysilicon layer 41 and a second P-type low temperature polysilicon layer 43. Between the N-type low temperature polysilicon layer 41 and the second P-type low temperature polysilicon layer 43 is the second intrinsic low temperature polysilicon layer 42. The second N-type low temperature polysilicon layer 41, the second intrinsic low temperature polysilicon layer 42, and the second P-type low temperature polysilicon layer 43 constitute the second photodiode; meanwhile, in order to simplify the structure of the image sensor, the second N-type low temperature polysilicon layer 41 also serves as the first N-type low temperature polysilicon layer of the first photodiode. Amorphous silicon is deposited on the first N-type low temperature polysilicon layer, the amorphous silicon is doped to form P-type amorphous silicon thereon, and the amorphous silicon is patterned to form the first intrinsic amorphous silicon layer 7 and the first P-type amorphous silicon layer 8. The first N-type low temperature polysilicon layer, the first intrinsic amorphous silicon layer 7 and the first P-type amorphous silicon layer 8 constitute the first photodiode.

A conductive material is deposited on the first P-type amorphous silicon layer 8 to form the second electrode 9. In order to ensure that light enters the first photodiode, the second electrode 9 needs to be transparent. Therefore, a transparent conductive material ITO or IZO can be used to form the second electrode 9.

In this embodiment, the second photodiode adopts a lateral structure, and the second N-type low temperature polysilicon layer, the second P-type low temperature polysilicon layer, and the second intrinsic low temperature polysilicon layer are located in the same layer;

the first photodiode adopts a vertical structure, and the first N-type low temperature polysilicon layer, the first intrinsic amorphous silicon layer, and the first P-type amorphous silicon layer are sequentially stacked in a direction away from the substrate.

The second photodiode is covered with a gate insulation layer 5, and a gate 61 of the switching thin film transistor is formed on the gate insulation layer 5; an interlayer insulation layer 10 covers the first photodiode, and a source-drain metal layer is formed on the interlayer insulation layer 10. The pattern of the source-drain metal layer includes a first electrode 111, a source 112 of the switching thin film transistor, and a drain 113 of the switching thin film transistor. Among them, the second N-type low temperature polysilicon layer 41 of the second photodiode is led out through the first electrode 111, that is, the first electrode 111 also serves as the third electrode of the second photodiode at the same time, or in other words, the first electrode 111 and the third electrode of the two photodiode are an integral structure; the second P-type low temperature polysilicon layer 43 of the second photodiode is led out through the second electrode 9, that is, the second electrode 9 also serves as the fourth electrode of the second photodiode at the same time, or in other words, the second electrode 9 and the fourth electrode of the second photodiode are an integral structure. In this way, the structure of the image sensor can be simplified. The first N-type low temperature polysilicon layer of the first photodiode is led out through the first electrode 111, and the first P-type amorphous silicon layer 8 of the first photodiode is led out through the second electrode 9. The switching thin film transistor is composed of the gate 61, the source 112 and the drain 113. The source 112 is connected to the second electrode 9 and can draw out the signals of the first photodiode and the second photodiode.

In this embodiment, the second electrode 9 is located on a side of the first P-type amorphous silicon layer 8 away from the substrate 3, and an orthographic projection of the second electrode 9 on the substrate 3 at least partially overlaps with an orthographic projection of the first P-type amorphous silicon layer 8 on the substrate 3. Specifically, the orthographic projection of the first P-type amorphous silicon layer 8 on the substrate 3 is located in the orthographic projection of the second electrode 9 on the substrate 3, the second electrode 9 has a portion that exceeds the area where the first P-type amorphous silicon layer 8 is located, and this portion is connected with the second P-type low temperature polysilicon layer 43.

The image sensor also includes a planarization layer 12 covering the source-drain metal layer. A transparent conductive layer 13 is provided on the planarization layer 12. The transparent conductive layer 13 and the source-drain metal layer can be used to prepare two electrode plates of the capacitor 117, respectively.

In the present embodiment, the capacitor 117 comprises a first electrode plate and a second electrode plate, the first electrode plate is connected to the first electrode, and the second electrode plate is connected to the second electrode.

Optionally, an orthographic projection of the second intrinsic low temperature polysilicon layer 42 on the substrate 3 and an orthographic projection of the first intrinsic amorphous silicon layer 7 on the substrate 3 may partially overlap.

In this embodiment, the band gap of amorphous silicon can be changed by adjusting the deposition process of amorphous silicon, thereby changing the detection wavelength of the first photodiode, so that the detection waveband of the first photodiode may be different from or the same as that of the second photodiode. When the detection waveband of the first photodiode is different from that of the second photodiode, the image sensor can achieve different functions; when the detection waveband of the first photodiode is the same as that of the second photodiode, the signal strength can be increased, and the detection accuracy can be improved.

Figure 3:
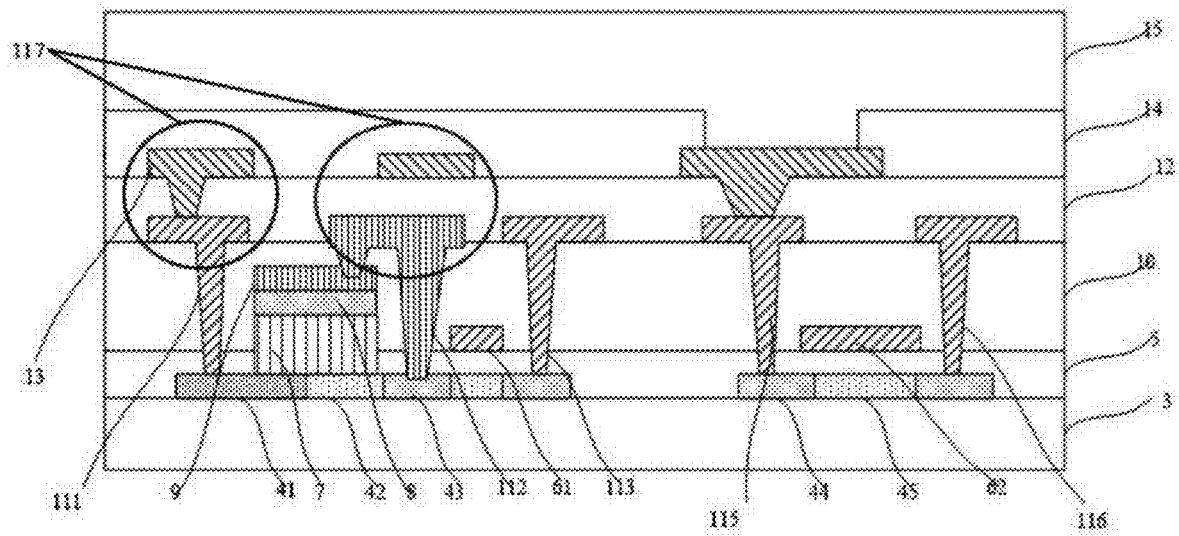

In another specific embodiment, as shown in FIG. 3, the image sensor includes a low temperature polysilicon layer on the substrate 3, and ion doping is performed on the low temperature polysilicon layer to form a second N-type low temperature polysilicon layer 41 and a second P-Type low temperature polysilicon layer 43, between the second N-type low temperature polysilicon layer 41 and the second P-type low temperature polysilicon layer 43 is the second intrinsic low temperature polysilicon layer 42. The second N type low temperature polysilicon layer 41, the second intrinsic low temperature polysilicon layer 42 and the second P-type low temperature polysilicon layer 43 constitute the second photodiode; meanwhile, in order to simplify the structure of the image sensor, the second N-type low temperature polysilicon layer 41 also serves as the first N-type low temperature polysilicon layer of the first photodiode. Amorphous silicon is deposited on the first N-type low temperature polysilicon layer, the amorphous silicon is doped, P-type amorphous silicon is formed thereon, and then the amorphous silicon is patterned to form the first intrinsic amorphous silicon layer 7 and the first P-type amorphous silicon layer 8. The first N-type low temperature polysilicon layer, the first intrinsic amorphous silicon layer 7, and the first P-type amorphous silicon layer 8 constitute the first photodiode.

A conductive material is deposited on the first P-type amorphous silicon layer 8 to form the second electrode 9. In order to ensure that light enters the first photodiode, the second electrode 9 needs to be transparent. Therefore, a transparent conductive material ITO or IZO can be used to form the second electrode 9.

Optionally, the orthographic projection of the second electrode 9 on the substrate 3 coincides with both the orthographic projections of the first P-type amorphous silicon layer 8 and the first intrinsic amorphous silicon layer 7 on the substrate 3, so that the P-type amorphous silicon may not be patterned just after the P-type amorphous silicon is formed; instead, after the conductive material is formed, the amorphous silicon layer and the conductive material are patterned together to form the second electrode 9, the first intrinsic amorphous silicon layer 7 and the first P-type amorphous silicon layer 8, which can save the number of patterning processes and reduce the production cost of the image sensor.

In this embodiment, the second photodiode adopts a lateral structure, and the second N-type low temperature polysilicon layer, the second P-type low temperature polysilicon layer, and the second intrinsic low temperature polysilicon layer are located in the same layer;

the first photodiode adopts a vertical structure, and the first N-type low temperature polysilicon layer, the first intrinsic amorphous silicon layer, and the first P-type amorphous silicon layer are sequentially stacked in a direction away from the substrate.

The second photodiode is covered with a gate insulation layer 5, and a gate 61 of the switching thin film transistor is formed on the gate insulation layer 5; an interlayer insulation layer 10 covers the first photodiode, and a source-drain metal layer is formed on the interlayer insulation layer 10. The pattern of the source-drain metal layer includes a first electrode 111, a source 112 of the switching thin film transistor, and a drain 113 of the switching thin film transistor. Among them, the second N-type low temperature polysilicon layer 41 of the second photodiode is led out through the first electrode 111, that is, the first electrode 111 also serves as the third electrode of the second photodiode at the same time, or in other words, the first electrode 111 and the third electrode of the two photodiode are an integral structure; the second P-type low temperature polysilicon layer 43 of the second photodiode is led out through the source 112 of the switching thin film transistor, that is, the source 112 of the switching thin film transistor also serves as the fourth electrode of the second photodiode at the same time, or in other words, the source 112 of the switching thin film transistor and the fourth electrode of the second photodiode are an integral structure. In this way, the structure of the image sensor can be simplified. The first N-type low temperature polysilicon layer of the first photodiode is led out through the first electrode 111, and the first P-type amorphous silicon layer 8 of the first photodiode is led out through the second electrode 9. The switching thin film transistor is composed of the gate 61, the source 112 and the drain 113. The source 112 is connected to the second electrode 9 and can draw out the signals of the first photodiode and the second photodiode.

The image sensor also includes a planarization layer 12 covering the source-drain metal layer. A transparent conductive layer 13 is provided on the planarization layer 12. The transparent conductive layer 13 and the source-drain metal layer can be used to prepare two electrode plates of the capacitor 117, respectively.

Optionally, an orthographic projection of the second intrinsic low temperature polysilicon layer 42 on the substrate 3 and an orthographic projection of the first intrinsic amorphous silicon layer 7 on the substrate 3 may partially overlap.

In this embodiment, the band gap of amorphous silicon can be changed by adjusting the deposition process of amorphous silicon, thereby changing the detection wavelength of the first photodiode, so that the detection waveband of the first photodiode may be different from or the same as that of the second photodiode. When the detection waveband of the first photodiode is different from that of the second photodiode, the image sensor can achieve different functions; when the detection waveband of the first photodiode is the same as that of the second photodiode, the signal strength can be increased, and the detection accuracy can be improved.

Figure 4:
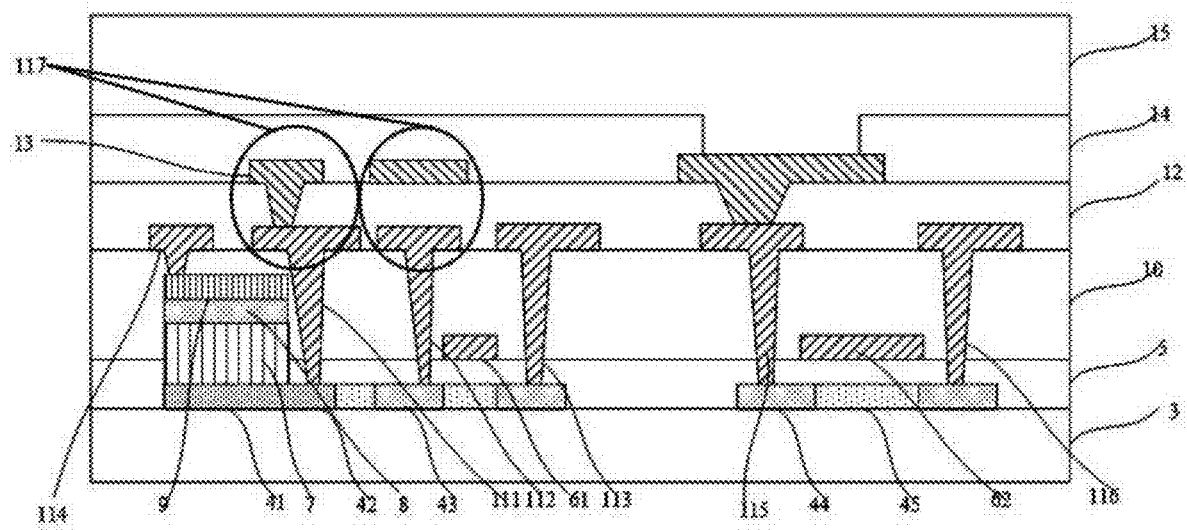

In another specific embodiment, as shown in FIG. 4, the image sensor includes a low temperature polysilicon layer on the substrate 3, and ion doping is performed on the low temperature polysilicon layer to form a second N-type low temperature polysilicon layer 41 and a second P-Type low temperature polysilicon layer 43, between the second N-type low temperature polysilicon layer 41 and the second P-type low temperature polysilicon layer 43 is the second intrinsic low temperature polysilicon layer 42. The second N type low temperature polysilicon layer 41, the second intrinsic low temperature polysilicon layer 42 and the second P-type low temperature polysilicon layer 43 constitute the second photodiode; meanwhile, in order to simplify the structure of the image sensor, the second N-type low temperature polysilicon layer 41 also serves as the first N-type low temperature polysilicon layer of the first photodiode. Amorphous silicon is deposited on the first N-type low temperature polysilicon layer, the amorphous silicon is doped, P-type amorphous silicon is formed thereon, and then the amorphous silicon is patterned to form the first intrinsic amorphous silicon layer 7 and the first P-type amorphous silicon layer 8. The first N-type low temperature polysilicon layer, the first intrinsic amorphous silicon layer 7, and the first P-type amorphous silicon layer 8 constitute the first photodiode.

A conductive material is deposited on the first P-type amorphous silicon layer 8 to form the second electrode 9. In order to ensure that light enters the first photodiode, the second electrode 9 needs to be transparent. Therefore, a transparent conductive material ITO or IZO can be used to form the second electrode 9.

Optionally, the orthographic projection of the second electrode 9 on the substrate 3 coincides with both the orthographic projections of the first P-type amorphous silicon layer 8 and the first intrinsic amorphous silicon layer 7 on the substrate 3, so that the P-type amorphous silicon may not be patterned just after the P-type amorphous silicon is formed; instead, after the conductive material is formed, the amorphous silicon layer and the conductive material are patterned together to form the second electrode 9, the first intrinsic amorphous silicon layer 7 and the first P-type amorphous silicon layer 8, which can save the number of patterning processes and reduce the production cost of the image sensor.

In this embodiment, the second photodiode adopts a lateral structure, and the second N-type low temperature polysilicon layer, the second P-type low temperature polysilicon layer, and the second intrinsic low temperature polysilicon layer are located in the same layer;

the first photodiode adopts a vertical structure, and the first N-type low temperature polysilicon layer, the first intrinsic amorphous silicon layer, and the first P-type amorphous silicon layer are sequentially stacked in a direction away from the substrate.

The second photodiode is covered with a gate insulation layer 5, and a gate 61 of the switching thin film transistor is formed on the gate insulation layer 5; an interlayer insulation layer 10 covers the first photodiode, and a source-drain metal layer is formed on the interlayer insulation layer 10. The pattern of the source-drain metal layer includes a first electrode 111, a source 112 of the switching thin film transistor, a drain 113 of the switching thin film transistor, and a connection line 114. Among them, the second N-type low temperature polysilicon layer 41 of the second photodiode is led out through the first electrode 111, that is, the first electrode 111 also serves as the third electrode of the second photodiode at the same time, or in other words, the first electrode 111 and the third electrode of the two photodiode are an integral structure; the second P-type low temperature polysilicon layer 43 of the second photodiode is led out through the source 112, that is, the source 112 also serves as the fourth electrode of the second photodiode at the same time, or in other words, the source 112 and the fourth electrode of the second photodiode are an integral structure. In this way, the structure of the image sensor can be simplified. The first N-type low temperature polysilicon layer of the first photodiode is led out through the first electrode 111, and the first P-type amorphous silicon layer 8 of the first photodiode is led out through the second electrode 9. The second electrode 9 may be connected to the source 112 through the connection line 114. The switching thin film transistor is composed of the gate 61, the source 112 and the drain 113. The source 112 is connected to the second electrode 9 through the connected line 114, and can draw out the signals of the first photodiode and the second photodiode.

The image sensor also includes a planarization layer 12 covering the source-drain metal layer. A transparent conductive layer 13 is provided on the planarization layer 12. The transparent conductive layer 13 and the source-drain metal layer (e.g. 112) can be used to prepare two electrode plates of the capacitor 117, respectively.

Optionally, an orthographic projection of the second intrinsic low temperature polysilicon layer 42 on the substrate 3 and an orthographic projection of the first intrinsic amorphous silicon layer 7 on the substrate 3 do not overlap at all, so that the second photodiode receives more light and the detection accuracy is improved.

In this embodiment, the band gap of amorphous silicon can be changed by adjusting the deposition process of amorphous silicon, thereby changing the detection wavelength of the first photodiode, so that the detection waveband of the first photodiode is different from or the same as that of the second photodiode. When the detection waveband of the first photodiode is different from that of the second photodiode, the image sensor can achieve different functions; when the detection waveband of the first photodiode is the same as that of the second photodiode, the signal strength can be increased, and the detection accuracy can be improved.

The embodiments of the present disclosure further provides a display device which includes the above image sensor. The image sensor can be integrated in the display device to realize image detection while realizing the display function.

The display device includes but is not limited to: a radio frequency unit, a network module, an audio output unit, an input unit, a sensor, a display unit, a user input unit, an interface unit, a storage, a processor, a power supply, etc. Those skilled in the art can understand that the above structure of the display device does not constitute a limitation on the display device, and the display device may include more or less of the above components, or combine some components, or have different component arrangement. In the embodiments of the present disclosure, the display device includes, but is not limited to, a display, a mobile phone, a tablet computer, a television, a wearable electronic device, a navigation display device, and the like.

The display device may be any product or component with a display function, such as a TV, a monitor, a digital photo frame, a mobile phone, a tablet computer, etc., wherein the display device also includes a flexible circuit board, a printed circuit board, and a back panel.

In some embodiments, the display device includes a driving thin film transistor and a light emitting unit connected to the driving thin film transistor, a gate of the driving thin film transistor and a gate of the switching thin film transistor are arranged in a same layer by using a same material; and/or a source of the driving thin film transistor and a source of the switching thin film transistor are arranged in a same layer by using a same material; and/or a drain of the driving thin film transistor and a drain of the switching thin film transistor are arranged in a same layer by using a same material; and/or an active layer of the driving thin film transistor and an active layer of the switching thin film transistor are arranged in a same layer by using a same material.

As shown in FIGS. 2 to 4, the driving thin film transistor includes a gate 62, a source-drain contact area 44, an active layer 45, a source 115 and a drain 116. Among them, the source 115 and the drain 116 are connected to the source-drain contact area, respectively. In this embodiment, the gate 62 and the gate 61 may be arranged in a same layer by using a same material, so that the gate 61 and the gate 62 can be formed by a single patterning process, reducing the number of patterning processes; the source-drain contact area 44, the active layer 45, the second N-type low temperature polysilicon layer 41, the second P-type low temperature polysilicon layer 43, and the second intrinsic low temperature polysilicon layer 42 may be arranged in a same layer by using a same material, so that the second N-type low temperature polysilicon layer 41, the second P-type low temperature polysilicon layer 43, the second intrinsic low temperature polysilicon layer 42, the source-drain contact area 44, and the active layer 45 can be formed by a single patterning process. reducing the number of patterning processes; the source 115 and the drain 116, the source 112 and the drain 113 may be arranged in a same layer by using a same material, so that the source 115 and the drain 116, the source 112 and the drain 113 can be formed by a single patterning process, reducing the number of patterning processes.

In some embodiments, the light emitting unit includes an anode, a cathode, and a light emitting layer located between the anode and the cathode, the anode and the second electrode plate of the capacitor are arranged in a same layer by using a same material, so that the anode and the second electrode plate can be formed by a single patterning process, which can reduce the number of patterning processes, wherein both the second electrode plate and the anode can be made of transparent conductive layer 13; and/or the first electrode plate of the capacitor and the source of the driving thin film transistor are arranged in a same layer by using a same material, so that the source of the driving thin film transistor and the first electrode plate can be formed by a single patterning process, which can reduce the number of patterning processes.

In a case that the image sensor is integrated in the display device, as shown in FIGS. 2 to 4, the display device further includes a pixel definition layer 14 and an encapsulation layer 15, wherein the light emitting unit is located in a pixel area defined by the pixel definition layer 14.

The embodiments of the present disclosure further provides a manufacturing method of an image sensor which includes:

providing a substrate;

forming a first photodiode and a second photodiode on the substrate, the first photodiode including a first electrode, a second electrode, and a first semiconductor structure located between the first electrode and the second electrode, the second photodiode including a third electrode, a fourth electrode, and a second semiconductor structure located between the third electrode and the fourth electrode, the first electrode being connected to the third electrode, the second electrode being connected to the fourth electrode;

forming a switching thin film transistor on the substrate, a source or a drain of the switching thin film transistor being connected to the second electrode or the first electrode;

forming a capacitor on the substrate, the capacitor including a first electrode plate and a second electrode plate, the first electrode plate being connected to the first electrode, the second electrode plate being connected to the second electrode.

In the embodiment, the image sensor includes two photodiodes connected in parallel, the two photodiodes share a capacitor, and the two photodiodes charge the capacitor at the same time, which can increase the signal strength and improve the detection accuracy; on the other hand, the two photodiodes can detect different wavebands to achieve different application effects. For example, the first photodiode can detect the visible light waveband for fingerprint recognition, and the second photodiode can detect the infrared light waveband.

Optionally, the first electrode is connected to the third electrode, and the second electrode is connected to the fourth electrode, thereby realizing the parallel connection of the first photodiode and the second photodiode; one of the source and drain of the switching thin film transistor is connected to the second electrode or the first electrode, and the other can be connected to a detection signal line. FIG. 1 is a schematic circuit diagram of the image sensor. The first photodiode 1 and the second photodiode 2 are connected in parallel. When the image sensor receives light, the first photodiode 1 and the second photodiode 2 generate electrical signals and store them in the capacitor. After the capacitor is fully charged, the switching thin film transistor is turned on and the capacitor is discharged. And thus the signals generated by the two photodiodes can be transmitted to the detection signal line, and then transmitted by the detection signal line to a corresponding circuit for processing, so as to realize the detection of light intensity.

In order to simplify the structure of the image sensor, in some embodiments, the second electrode and the fourth electrode are an integral structure, and/or, the first electrode and the third electrode are an integral structure, and it may also be possible that the first electrode and the third electrode are an integral structure.

A photodiode generally adopts a PIN structure, which is composed of an N-type semiconductor layer, a P-type semiconductor layer, and an intrinsic semiconductor layer located between the N-type semiconductor layer and the P-type semiconductor layer. Among them, the semiconductor layer can be made of low temperature polysilicon or amorphous silicon. Since the band gap of the amorphous silicon can be changed by adjusting the deposition process of the amorphous silicon, the absorption wavelength of the amorphous silicon can be changed. Therefore, the intrinsic semiconductor layer of at least one of the first photodiode and the second photodiode can be made of amorphous silicon, so that the detection wavelength of at least one of the first photodiode and the second photodiode can be adjusted, so that the two photodiodes can detect different wavebands to achieve different application effect. Of course, if the detection wavebands of the first photodiode and the second photodiode are the same, the semiconductor layers of both the first photodiode and the second photodiode can be made of low temperature polysilicon.

If the detection wavebands of the first photodiode and the second photodiode are different, the image sensor can achieve different application effects. For example, the first photodiode can detect visible light and the second photodiode can detect infrared light. Thus, the sensor can detect both visible light and infrared light. The image sensor can detect the visible light band for fingerprint recognition, and it can also detect the infrared light band for night scene imaging.

In some embodiments, the forming the first semiconductor structure includes:
sequentially forming a first N-type low temperature polysilicon layer, a first intrinsic amorphous silicon layer, and a first P-type amorphous silicon layer in a direction away from the substrate;
the forming the second semiconductor structure includes:
forming a second N-type low temperature polysilicon layer, a second P-type low temperature polysilicon layer, a second intrinsic low temperature polysilicon layer located between the second N-type low temperature polysilicon layer and the second P-type low temperature polysilicon layer, which are arranged in a same layer.

In some embodiments, the forming the first semiconductor structure includes:
depositing an amorphous silicon layer;
doping the amorphous silicon layer to form the first intrinsic amorphous silicon layer and the first P-type amorphous silicon layer;
wherein, when the amorphous silicon layer is deposited, the band gap of the amorphous silicon layer is adjusted so that the detection wavebands of the first photodiode and the second photodiode are different.

It should be noted that the various embodiments in this specification are described in a progressive manner, and the same or similar parts between the various embodiments can be referred to each other, and each embodiment focuses on the differences from other embodiments. In particular, for the method embodiment, since it is basically similar to the product embodiment, the description is relatively simple, and the relevant part can be referred to the part of the description of the product embodiment.

Unless otherwise defined, the technical or scientific terms used in the present disclosure shall have the usual meanings understood by those with ordinary skills in the field to which this disclosure belongs. "First", "second" and similar words used in the present disclosure do not indicate any order, quantity or importance, but are only used to distinguish different components. "Comprising" or "including" or another similar word means that the element or item appearing before the word encompasses the element or item listed after the word and its equivalents, but does not exclude other elements or items. "connecting" or "connected" or another similar word is not limited to physical or mechanical connection, but may include an electrical connection, whether direct or indirect. "Up", "down", "left", "right", etc. are only used to indicate the relative position relationship. When the absolute position of the described object changes, the relative position relationship may also change accordingly.

It can be understood that when an element such as a layer, film, region, or substrate is referred to as being "on" or "under" another element, the element can be "directly on" or "directly under" the other element, or there may be intermediate elements.

In the description of the foregoing embodiments, specific features, structures, materials, or characteristics may be combined in any one or more embodiments or examples in an appropriate manner.

The above are only specific implementations of the present disclosure, but the protection scope of the present disclosure is not limited thereto. Variations or substitutions that can be easily conceived by any person skilled in the art within the technical scope disclosed in the present disclosure should be covered within the protection scope of the present disclosure. Therefore, the protection scope of the present disclosure should be subject to the protection scope of the claims.

What is claimed is:

1. An image sensor, comprising:
a substrate;
a first photodiode and a second photodiode located on the substrate, the first photodiode comprising a first electrode, a second electrode, and a first semiconductor structure located between the first electrode and the second electrode, the second photodiode comprising a third electrode, a fourth electrode, and a second semiconductor structure located between the third electrode and the fourth electrode, the first electrode being connected to the third electrode, the second electrode being connected to the fourth electrode;
a switching thin film transistor, a source or a drain of the switching thin film transistor being connected to the second electrode or the first electrode; and
a capacitor connected in parallel with the first photodiode and the second photodiode for storing electrical signals when the image sensor receives light.

2. The image sensor according to claim 1, wherein the second electrode and the fourth electrode are an integral structure, and/or, the first electrode and the third electrode are an integral structure.

3. The image sensor according to claim 2, wherein the capacitor comprises a first electrode plate and a second electrode plate, the first electrode plate is connected to the first electrode, the second electrode plate is connected to the second electrode.

4. The image sensor according to claim 1, wherein the first semiconductor structure comprises: a first N-type low temperature polysilicon layer, a first P-type amorphous silicon layer, a first intrinsic amorphous silicon layer located between the first N-type low temperature polysilicon layer and the first P-type amorphous silicon layer;
the second semiconductor structure comprises: a second N-type low temperature polysilicon layer, a second P-type low temperature polysilicon layer, a second intrinsic low temperature polysilicon layer located between the second N-type low temperature polysilicon layer and the second P-type low temperature polysilicon layer.

5. The image sensor according to claim 4, wherein the first N-type low temperature polysilicon layer also serves as the second N-type low temperature polysilicon layer.

6. The image sensor according to claim 4, wherein the second N-type low temperature polysilicon layer, the second P-type low temperature polysilicon layer and the second intrinsic low temperature polysilicon layer are located in a same layer;

the first N-type low temperature polysilicon layer, the first intrinsic amorphous silicon layer, and the first P-type amorphous silicon layer are sequentially stacked in a direction away from the substrate.

7. The image sensor according to claim 6, wherein the second electrode is located on a side of the first P-type amorphous silicon layer away from the substrate, an orthographic projection of the second electrode on the substrate at least partially overlaps with an orthographic projection of the first P-type amorphous silicon layer on the substrate, and the second electrode is a transparent electrode.

8. The image sensor according to claim 7, wherein the orthographic projection of the second electrode on the substrate coincides with the orthographic projection of the first P-type amorphous silicon layer on the substrate.

9. The image sensor according to claim 4, wherein an orthographic projection of the second intrinsic low temperature polysilicon layer on the substrate partially overlaps with or does not overlap with an orthographic projection of the first intrinsic amorphous silicon layer on the substrate.

10. The image sensor according to claim 1, wherein the first photodiode and the second photodiode have different detection wavebands.

11. A display device, comprising the image sensor according to claim 1.

12. The display device according to claim 11, wherein the display device comprises a driving thin film transistor and a light emitting unit connected to the driving thin film transistor, a gate of the driving thin film transistor and a gate of the switching thin film transistor are arranged in a same layer by using a same material; and/or a source of the driving thin film transistor and a source of the switching thin film transistor are arranged in a same layer by using a same material; and/or a drain of the driving thin film transistor and a drain of the switching thin film transistor are arranged in a same layer by using a same material; and/or an active layer of the driving thin film transistor and an active layer of the switching thin film transistor are arranged in a same layer by using a same material.

13. The display device according to claim 11, wherein the light emitting unit comprises an anode, a cathode, and a light emitting layer located between the anode and the cathode, the anode and a second electrode plate of the capacitor are arranged in a same layer by using a same material; and/or a first electrode plate of the capacitor and the source of the driving thin film transistor are arranged in a same layer by using a same material.

14. A manufacturing method of an image sensor, comprising:

providing a substrate;

forming a first photodiode and a second photodiode on the substrate, the first photodiode comprising a first electrode, a second electrode, and a first semiconductor structure located between the first electrode and the second electrode, the second photodiode comprising a third electrode, a fourth electrode, and a second semiconductor structure located between the third electrode and the fourth electrode, the first electrode being connected to the third electrode, the second electrode being connected to the fourth electrode;

forming a switching thin film transistor on the substrate, a source or a drain of the switching thin film transistor being connected to the second electrode or the first electrode;

forming a capacitor on the substrate, the capacitor comprising a first electrode plate and a second electrode plate, the first electrode plate being connected to the first electrode, the second electrode plate being connected to the second electrode.

15. The manufacturing method of an image sensor according to claim 14, wherein the forming the first semiconductor structure comprises:

sequentially forming a first N-type low temperature polysilicon layer, a first intrinsic amorphous silicon layer, and a first P-type amorphous silicon layer in a direction away from the substrate;

the forming the second semiconductor structure comprises:

forming a second N-type low temperature polysilicon layer, a second P-type low temperature polysilicon layer, a second intrinsic low temperature polysilicon layer located between the second N-type low temperature polysilicon layer and the second P-type low temperature polysilicon layer, which are arranged in a same layer.

16. The manufacturing method of an image sensor according to claim 15, wherein the forming the first semiconductor structure comprises:

depositing an amorphous silicon layer;

doping the amorphous silicon layer to form the first intrinsic amorphous silicon layer and the first P-type amorphous silicon layer;

wherein, when the amorphous silicon layer is deposited, a band gap of the amorphous silicon layer is adjusted so that detection wavebands of the first photodiode and the second photodiode are different.

* * * * *